United States Patent
Sewell

(10) Patent No.: US 7,409,759 B2
(45) Date of Patent: Aug. 12, 2008

(54) METHOD FOR MAKING A COMPUTER HARD DRIVE PLATEN USING A NANO-PLATE

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 505 days.

(21) Appl. No.: 11/012,474

(22) Filed: Dec. 16, 2004

(65) Prior Publication Data

US 2006/0130317 A1 Jun. 22, 2006

(51) Int. Cl. *G11B 5/62* (2006.01)
(52) U.S. Cl. ........... 29/603.01; 29/604; 29/417; 427/129; 427/130; 216/22; 360/135
(58) Field of Classification Search ............. 29/603.01, 29/604, 412, 417; 360/135; 427/129–132; 216/22
See application file for complete search history.

(56) References Cited

U.S. PATENT DOCUMENTS

| | | | |
|---|---|---|---|
| 5,669,303 A | 9/1997 | Maracas et al. | |
| 5,772,905 A | 6/1998 | Chou | |
| 6,238,271 B1 | 5/2001 | Cesna | |
| 6,264,848 B1 * | 7/2001 | Belser et al. | 216/22 |
| 6,365,059 B1 | 4/2002 | Pechenik | |
| 6,399,173 B1 | 6/2002 | Nagayama et al. | |
| 6,482,742 B1 | 11/2002 | Chou | |
| 6,507,456 B1 | 1/2003 | Dinan et al. | |
| 6,518,189 B1 | 2/2003 | Chou | |
| 6,531,202 B1 | 3/2003 | Litvinov et al. | |
| 6,601,629 B2 | 8/2003 | Toyoda et al. | |
| 6,656,021 B2 | 12/2003 | Ota et al. | |
| 6,740,209 B2 | 5/2004 | Shibamoto et al. | |
| 6,743,368 B2 | 6/2004 | Lee | |
| 6,757,116 B1 | 6/2004 | Curtiss et al. | |
| 6,809,356 B2 | 10/2004 | Chou | |
| 6,814,898 B1 | 11/2004 | Deeman et al. | |
| 6,869,557 B1 | 3/2005 | Wago et al. | |

(Continued)

FOREIGN PATENT DOCUMENTS

EP 0 617 457 A2 9/1994

(Continued)

OTHER PUBLICATIONS

Harry Sewell, U.S. Appl. No. 11/288,135, filed Nov. 29, 2005, entitled "System and Method for Forming Nanodisks Used in Imprint Lithography and Nanodisk and Memory Disk Formed Thereby".

(Continued)

*Primary Examiner*—A. Dexter Tugbang
(74) *Attorney, Agent, or Firm*—Sterne, Kessler, Goldstein & Fox, P.L.L.C.

(57) ABSTRACT

Provided is a method and system for manufacturing a hard drive platen. The method includes depositing two or more types of film around a central core to form a plurality of film layers, each film layer being of a different type than its adjacent layers. Next, the deposited film layers are sectioned to expose a patterned surface. The patterned surface is then planarized and selectively etched to expose patterns comprised of one of the types of film to a predetermined depth to produce a selectively etched surface. Magnetic material it deposited within etches of the surface and the surface is then planarized to form separated magnetic tracks therein.

20 Claims, 6 Drawing Sheets

U.S. PATENT DOCUMENTS

| | | |
|---|---|---|
| 6,951,173 B1 | 10/2005 | Meissl et al. |
| 6,964,793 B2 | 11/2005 | Willson et al. |
| 2002/0071214 A1* | 6/2002 | Belser .................. 360/135 |
| 2002/0114978 A1 | 8/2002 | Chang et al. |
| 2003/0091865 A1 | 5/2003 | Chen et al. |
| 2003/0104316 A1 | 6/2003 | Wang et al. |
| 2003/0127007 A1 | 7/2003 | Sakurai et al. |
| 2003/0203319 A1 | 10/2003 | Lee |
| 2004/0090610 A1 | 5/2004 | Hatakeyama et al. |
| 2004/0101713 A1 | 5/2004 | Wachenschwanz et al. |
| 2004/0124566 A1 | 7/2004 | Sreenivasan et al. |
| 2004/0132301 A1 | 7/2004 | Harper et al. |
| 2004/0169441 A1 | 9/2004 | Choi et al. |
| 2004/0182820 A1 | 9/2004 | Motowaki et al. |
| 2004/0195202 A1 | 10/2004 | Pechenik |
| 2004/0197712 A1 | 10/2004 | Jacobson et al. |
| 2004/0202865 A1 | 10/2004 | Homola et al. |
| 2004/0209123 A1 | 10/2004 | Bajorek et al. |
| 2004/0211755 A1 | 10/2004 | Yusa et al. |
| 2005/0116370 A1 | 6/2005 | Ogino et al. |
| 2005/0118817 A1 | 6/2005 | Fujita et al. |
| 2005/0130074 A1 | 6/2005 | Krause et al. |
| 2005/0133954 A1 | 6/2005 | Homola |
| 2005/0146078 A1 | 7/2005 | Chou et al. |
| 2005/0150862 A1 | 7/2005 | Harper et al. |
| 2005/0151282 A1 | 7/2005 | Harper et al. |
| 2005/0151300 A1 | 7/2005 | Harper et al. |
| 2005/0155554 A1 | 7/2005 | Saito |
| 2005/0156342 A1 | 7/2005 | Harper et al. |
| 2005/0158163 A1 | 7/2005 | Harper et al. |
| 2005/0167847 A1 | 8/2005 | Olsson |
| 2005/0172848 A1 | 8/2005 | Olsson |
| 2005/0191418 A1 | 9/2005 | Bietsch et al. |
| 2005/0212178 A1 | 9/2005 | Nien et al. |
| 2006/0130678 A1 | 6/2006 | Sewell |
| 2006/0131270 A1 | 6/2006 | Sewell |
| 2006/0131785 A1 | 6/2006 | Sewell |
| 2007/0121375 A1 | 5/2007 | Sewell |

FOREIGN PATENT DOCUMENTS

| | | |
|---|---|---|
| EP | 1 072 954 A2 | 1/2001 |
| JP | 5-314474 * | 11/1993 |
| WO | WO 01/59523 A1 | 8/2001 |
| WO | WO 02/42844 A2 | 5/2002 |
| WO | WO 02/42844 A3 | 5/2002 |
| WO | WO 02/091460 A2 | 11/2002 |
| WO | WO 02/091460 A3 | 11/2002 |
| WO | WO 03/099463 A2 | 12/2003 |
| WO | WO 03/099463 A3 | 12/2003 |
| WO | WO 2004/013697 A2 | 2/2004 |
| WO | WO 2004/013697 A3 | 2/2004 |
| WO | WO 2004/021083 A1 | 3/2004 |
| WO | WO 2004/099879 A2 | 11/2004 |

OTHER PUBLICATIONS

First Non-Final Rejection for U.S. Appl. No. 11/012,489, mailed on Dec. 19, 2006.
Final Rejection for U.S. Appl. No. 11/012,489, mailed on Jun. 15, 2007.
Non-Final Rejection for U.S. Appl. No. 11/012,598, mailed on Feb. 24, 2006.
Second Final Rejection for U.S. Appl. No. 11/012,598, mailed on Sep. 11, 2007.
Second Non-Final Rejection for U.S. Appl. No. 11/012,598, mailed on Mar. 27, 2007.
First Final Rejection for U.S. Appl. No. 11/012,598, mailed Sep. 21, 2006.
Non-Final Rejection U.S. Appl. No. 11/224,316, mailed Jul. 3, 2007.
International Search Report and Written Opinion for International Appl. No. PCT/US05/45458 mailed Sep. 4, 2007, 8 pgs.
Notice of Allowability for U.S. Appl. No. 11/288,135, mailed Aug. 6, 2007.
Non-Final Rejection for U.S. Appl. No. 11/012,489, mailed Oct. 29, 2007.
Notice of Allowability for U.S. Appl. No. 11/012,598, mailed Nov. 28, 2007.
Notice of Allowability for U.S. Appl. No. 11/224,316, mailed Jan. 2, 2008.
Second Notice of Allowability for U.S. Appl. No. 11/288,135, mailed Dec. 5, 2007.
Mortz, J. et al., "Patterned Media Made from Pre-etched Wafers: A Promising Route Toward Ultrahigh-Density Magnetic Recording," *IEEE Transactions on Magnetics*, vol. 38, No. 4, pp. 1731-1736 (Jul. 2002).

* cited by examiner

METHOD FOR MAKING A COMPUTER HARD DRIVE PLATEN USING A NANO-PLATE

BACKGROUND OF THE INVENTION

1. Field of the Invention

The present invention generally relates to the field of platens used in computer hard drives. More specifically, the present invention relates to the field of making platens from devices used in nano-imprint lithography.

2. Related Art

Platens used in hard drives for data storage on computers comprise flat disks coated with a thin film of magnetic storage media. A read/write head flies close to a surface of the platen, as it rotates, to transfer data from or to magnetic domains in a media film. Data is written into tracks which form concentric magnetic rings in the media.

Requirements for higher data storage density requires that the magnetized tracks are closer together and made narrower. As magnetic domains are pushed closer together, however, they reach a resolution limit for the separation of stored data bits. It also becomes difficult for the read/write heads to follow the magnetically defines tracks.

What is needed, therefore, is a method and system for developing magnetic storage media capable of accommodating higher data storage density requirements.

BRIEF SUMMARY OF THE INVENTION

Consistent with the principles of the present invention, as embodied and broadly described herein, the present invention includes a method for manufacturing a hard drive platen, for example. The method includes depositing two or more types of film around a central core to form a plurality of film layers, each film layer being of a different type than its adjacent layers. Next, the deposited film layers are sectioned to expose a patterned surface. The patterned surface is then polished and selectively etched to expose patterns comprised of one of the types of film to a predetermined depth to produce a selectively etched surface. Magnetic material is deposited to fill resulting etched trenches. The surface is then planarized to form a smooth surface with inlaid tracks of magnetic material. The surface having the tracks of magnetic material is then planarized.

The present invention provides several solutions to enabling magnetic media to accommodate higher data storage density requirements. More specifically, the prevent invention provides a techniques for creating a platen disk with physically separated tracks of magnetic media at line widths and pitch beyond the capabilities of either optical or electron beam lithography.

One exemplary approach for implementing technique of the present invention is to physically separate the magnetic media into tracks that isolate the magnetic domains and form a physical structure for the read/write heads to follow.

Further features and advantages of the present invention as well as the structure and operation of various embodiments of the present invention, as described in detail below with reference to the accompanying drawings.

BRIEF DESCRIPTION OF THE DRAWINGS/FIGURES

The accompanying drawings which are incorporated herein and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

Figure 1:
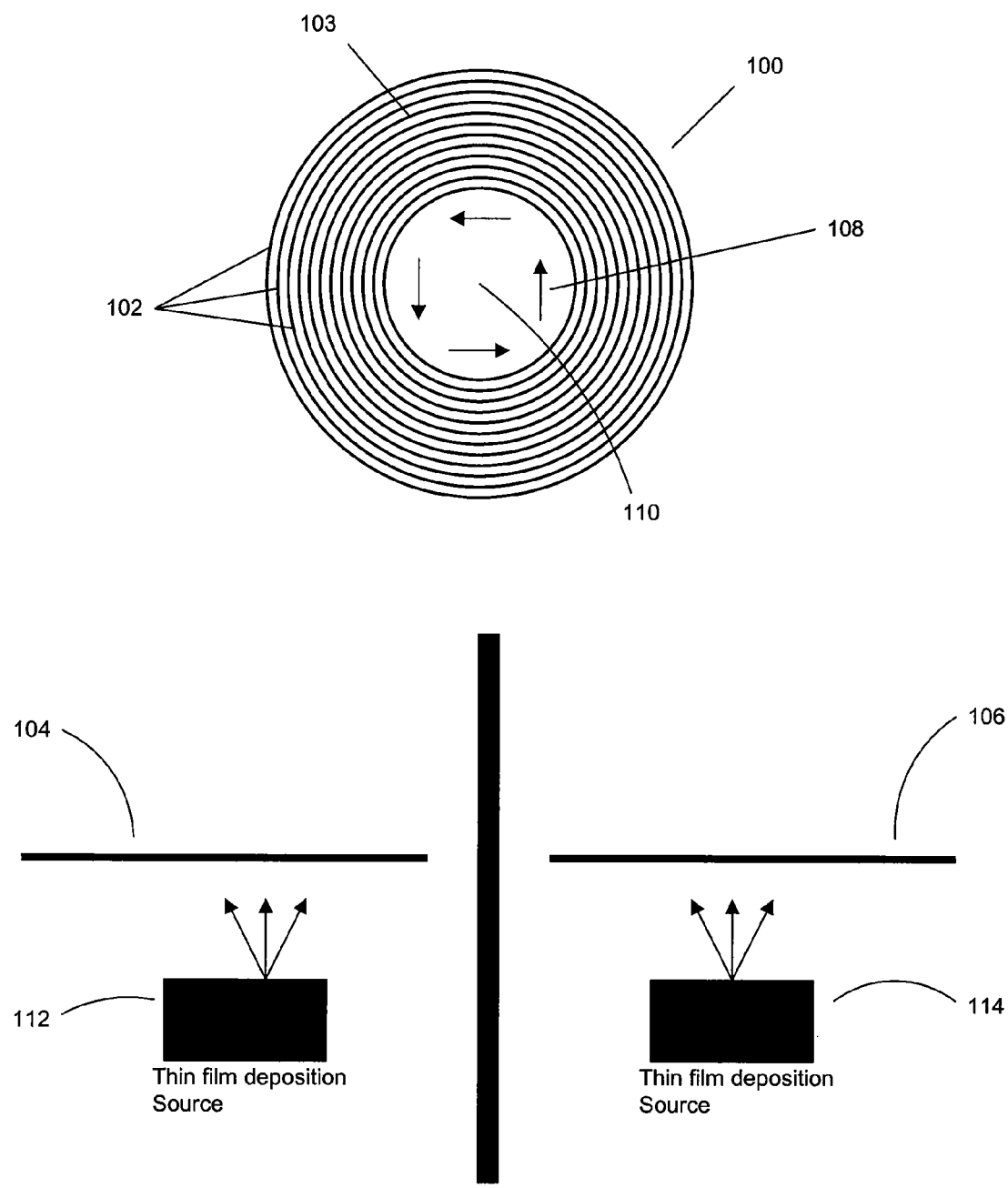
FIG. 1 is an illustration of an apparatus for making a computer hard drive platen in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware and/or the entities illustrated in the drawings. Thus, the operation and behavior of the present invention will be described with the understanding that modifications and variations of the embodiments are possible, given the level of detail presented herein.

FIG. 1 is an illustration of one exemplary technique of making a computer hard drive platen in accordance with an embodiment of the present invention. In FIG. 1, a boule 100 is built up, or developed, from possibly millions of deposited thin film layers 102 using a layering approach to form, for example, a ring layer structure 103.

The boule 100 is made by depositing thin films of two or more materials, such as materials 104 and 106, in an alternating manner onto the boule 100 as it rotates in a direction 108 around a central core 110. FIG. 1 illustrates the boule 100 rotating in a counter-clockwise direction for purposes of illustration only. The present invention is in no way limited to a counter-clockwise rotation. The central core 110 can be, for example, a solid rod, a hollow cylinder, or other similar structure. An exemplary diameter of the central core 110 might be greater than about 2 millimeters (mm).

The materials 104 and 106 are sequentially deposited using exemplary thin film deposition sources 112 and 114, respectively. In practice, as understood by one of skill in the art, to deposit of the materials 104 and 106, the boule 100 can be rotated as shown. Alternatively, however, the deposition sources 112 and 114 can be rotated around the central core 110, to create the circularly symmetrical ring layer structure 103. As illustrated in FIG. 1, the deposited film layers 102 form separate and concentric rings within the layer structure 103.

To form the separate concentric rings within the layer structure 103, during deposition, one of the sources 112 or 114 will switched off while a film comprised of a first of the materials 104 or 106 is being deposited by the other source.

When the film comprised of the first material (e.g. 104) is completed, its source (e.g., 112) would be switched off and the second source (114) would be activated to deposit the film comprised of the second material (106). This process continues until the desired thickness of the boule 100 is achieved.

Figure 1B:
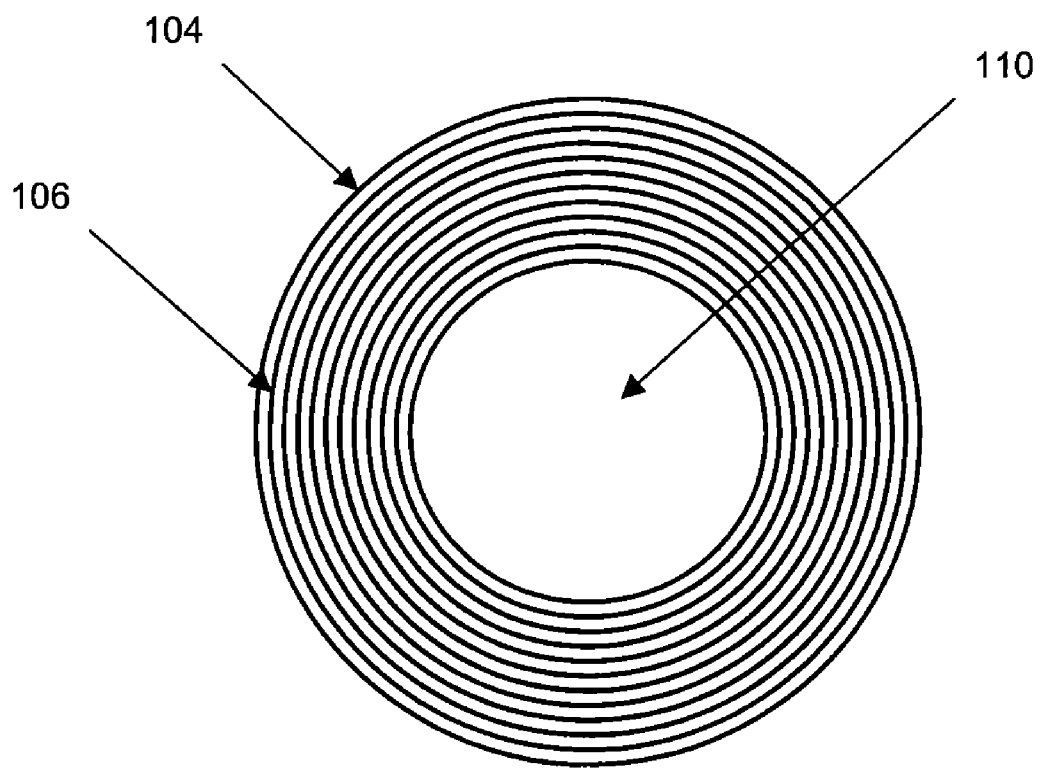
FIG. 1B is a more detailed illustration of a ring structure used within the apparatus illustrated in FIG. 1.

The deposition process noted above ultimately produces alternating layers of the materials 104 and 106, as illustrated in FIG. 1B. The materials 104 and 106 can comprise, by way of example, silicon dioxide, silicon nitride, and/or silicon. The materials 104 and 106 can also comprise heavy metallic materials, such as tungsten, tantalum, and molybdenum, to name a few.

In the example of FIG. 1, high rate magnetron biased sputtering was used as the boule 100 rotated. As noted above, however, it can be arranged whereby the sputter sources can be made to rotate around a stationary boule 100. Once the boule has been built up, typically to about 85 to 90 mm in diameter, platens can be made by slicing disks off the boule 100, using known slicing tools.

Figure 2:
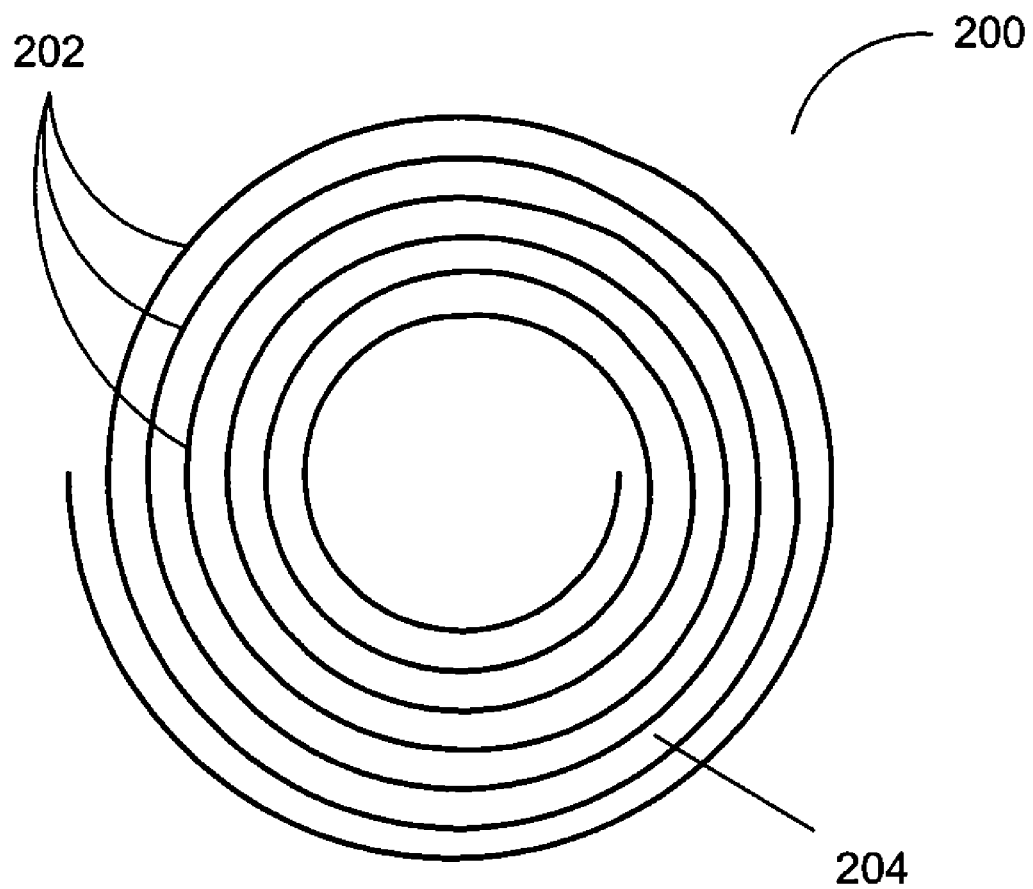
FIG. 2 is an illustration of an alternative to the ring structure of the apparatus shown in FIG. 1.

FIG. 2 is an illustration of an alternative approach 200 to the circularly symmetrical ring layer structure 103 of FIG. 1. In FIG. 2, a boule 200 can be developed to have rings 202 that form a spiral structure 204, using a baffled deposition process. To produce the spiral structure 204, for example, each deposition source can be set such that one revolution of the boule produces the required thickness of material. If a single revolution produces the desired thickness of material, then both of the sources, for example, the sources 112 and 114 of FIG. 1, can be on at the same time. That is, each of the sources 112 and 114 would be sequentially depositing a layer, one layer on top of the other, around the boule 200 continuously, to form the spiral structure 200.

The thin film deposition process can be accomplished using a variety of methods well known to those of skill in the art. For example, sputter deposition, chemical vapors deposition, Plasma Vapor Deposition or similar thin film deposition systems can be used. Deposition of the materials can be accomplished using two or more deposition sources.

The deposited thin films, such as the thin film layers 102, can be made from many material combinations. Within the context of the present invention, it is preferable that one or more of the material, such as the materials 104 and 106, be selectively etched. Additionally, the materials can be deposited in extremely smooth films, where there is no significant inter-diffusion of the layer during processing that will degrade the definition of the layer thickness. An example of readily available material combinations that can be used to form the discrete layers, and hence the rings are SiO2/Si3N4, SiO2/Si, SiO2/Ta, and SiO2 Magnetic Media Film. There also are other exemplary combinations not mentioned in the present application, but will become apparent to persons having ordinary skill in the art based on this description.

It is desirable that the deposition process be controlled to provide sufficiently smooth layers such that as the layers build up, there is no deviation from a smooth circular track. For example, bias magnetron sputter deposition can be used to maintain a very smooth deposited film surface while at the same time, achieving a high deposition rate.

To form individual magnetic disks, the boule 100 and the boule 200 can be cut up into disks that will have ring structures that, for example, resemble the ring sections of a tree trunk. The tree ring section platens cut from the boules undergo an initial planarization, or surface polishing, to provide a very flat surface.

Figure 3:
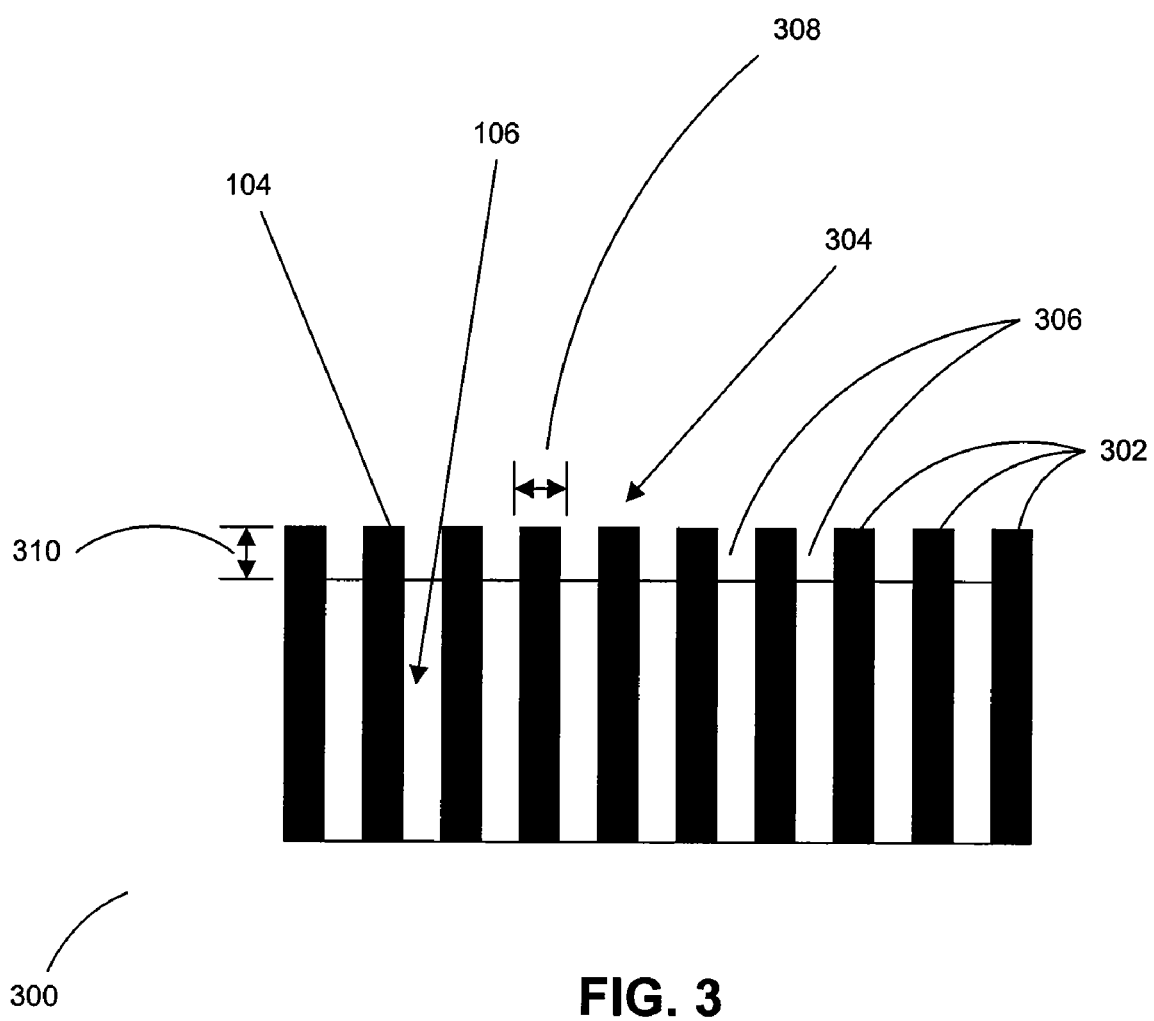
FIG. 3 is a cross-sectional portion of the ring structure illustrated in FIG. 1 in accordance with an embodiment of the present invention.

FIG. 3 is a cross-sectional portion (disk) 300 of the circularly symmetrical ring layer structure 103 of the boule 100. In the cross-sectional portion 300, tracks, such as the tracks 302, are formed in a polished platen surface 304 of the disk 300 by selectively etching the film layer comprising material 104 against the film layer comprising material 106. The tracks 302 are etched to form trenches, such as the trenches 306, in the platen surface 304. A width 308 of the tracks 302 can be within a range of about 1 to 100 nanometers (nm). A preferable width value is on the order of about 30 nm. The width 308 of the tracks correspond to line and space widths in the context of lithography terminology.

The trenches 306 are formed to a depth 310 of about 45 nm to form the 30 nm lines and spaces, noted above. The etching of the tracks 302 to form the trenches 306 can be accomplished using well known semiconductor etching techniques. For example, a plasma type etcher could be used to reactively etch, or vaporize, the film layers of the material 106 to form the trenches 306. Wet selective etching can also be used.

Figure 4:
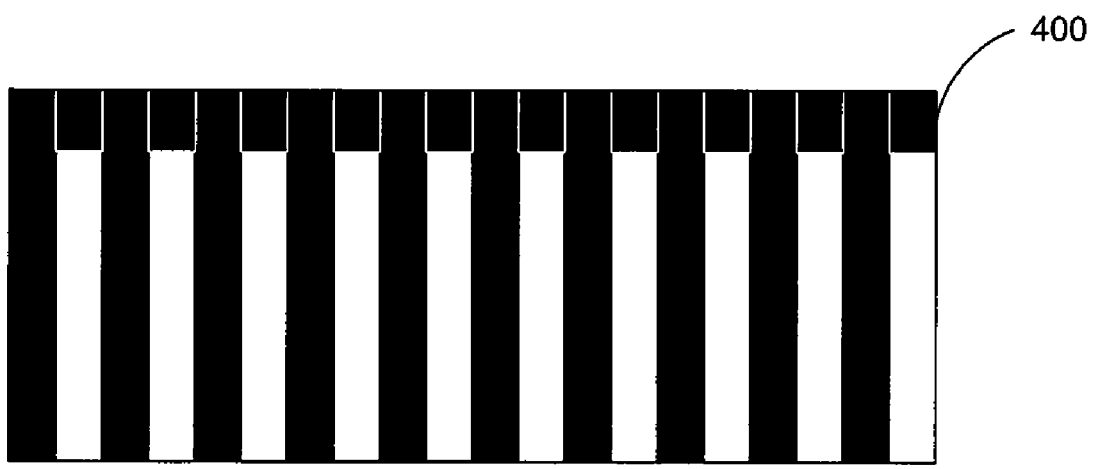
FIG. 4 is an illustration of the cross-sectional portion of FIG. 3 having a magnetic media deposited in grooved sections in accordance with the present invention and after being planarized.

FIG. 4 is an illustration of the cross-sectional portion 300 of FIG. 3 having a magnetic media deposited in the trenches 306 sections, in accordance with the present invention. In FIG. 4, the trenches 306 in the disk platen surface 304 are filled by coating the disk with magnetic media. The platen surface 304 is then planarized again to leave discrete isolated tracks of magnetic media 400 in the areas of the trenches 306 that were etched from the tracks 302.

Planarization can be achieved by using standard chemical mechanical polishing (CMP) processes. The planarization or smoothing can also be accomplished by sputter etching a planarizing resist coating with 1:1 selectively against the magnetic media 400 coat.

As noted above, platens can be formed having a central hole or bore, by building the boule up on a hollow tube, rather than a solid rod (coolant for the deposition process can be passed through the hollow tube to control the deposition processing temperature). Typically, quartz is used for the center of the boule although other materials can be used. The final data track width and spacing is controlled by the thin layer thickness for the deposited films. Layer thickness is controlled by deposition rate and rotation rates of the boule relative to the sources.

Extremely thin nano-plates can be cut and bonded to carrier plates (not shown) to reduce costs by increasing the number of disks per boule.

To provide format structures on the disk 300, the widths of the rings can be varied in a controlled manner. Formatting structures can be added to the disk 300 by using a lithographic printing process on the platen surface 304, before etching or after etching out the tracks 302 to form the trenches 306.

The nano-plate can be mounted on a central boss structure to ensure correct balance for high speed disk rotation. Both the upper and the lower surface of the disk can have data tracks formed on them. These upper and lower tracks will be perfectly aligned to each other The technique of the present invention is capable at defining the highest possible track resolutions. Track widths of 10 nm can be defined very uniformly which is beyond the capabilities of optical e-beam lithography. By changing track thicknesses or lithographically printing format structure can be defined on the disk. This method enables greater than 200 Terabyte hard drive capability.

Figure 5:
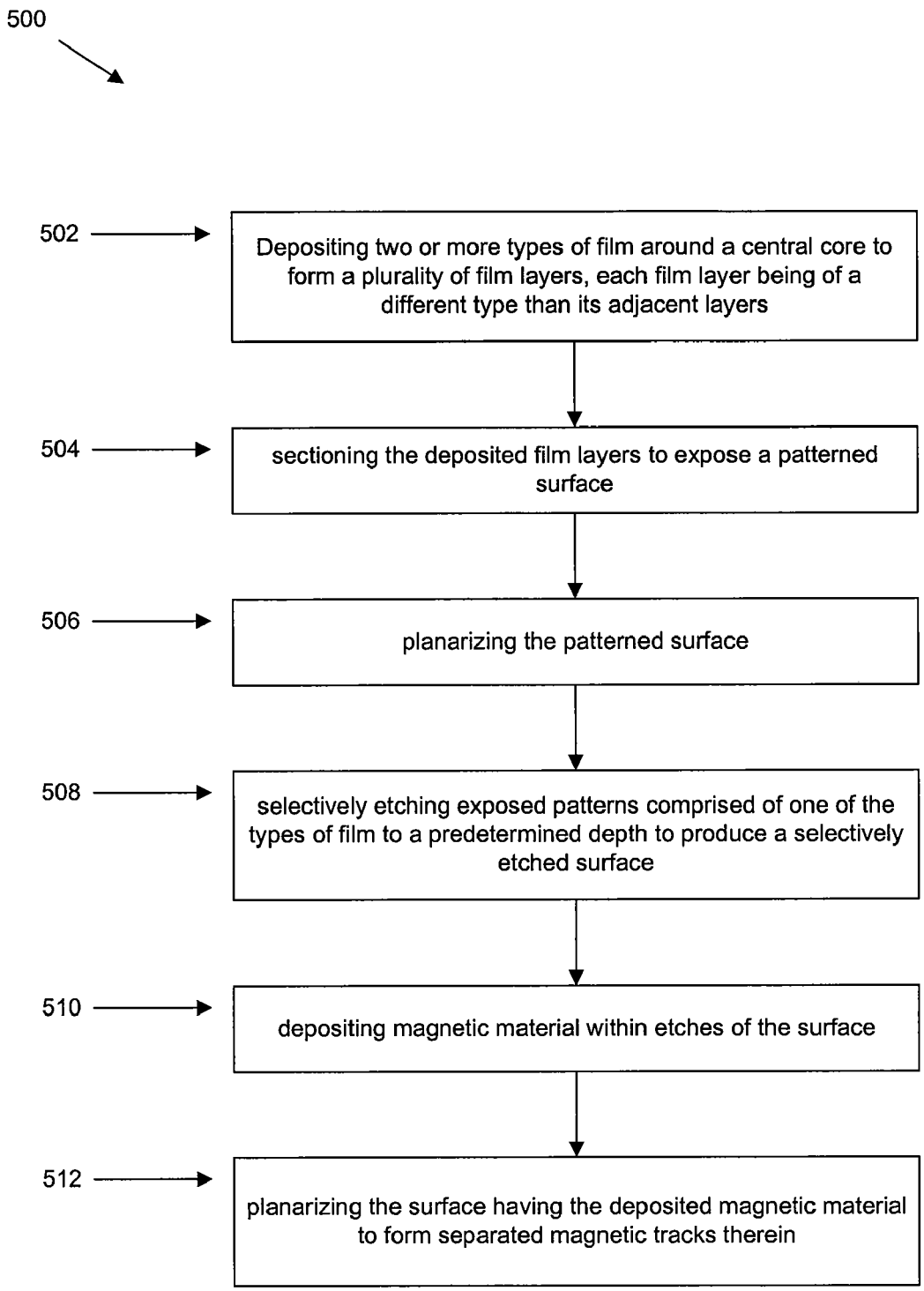
FIG. 5 is a flowchart of an exemplary method of practicing an embodiment of the present invention.

FIG. 5 is a flowchart of an exemplary method 500 of practicing an embodiment of the present invention. In FIG. 5, two or more types of film are deposited around a central core to form a plurality of film layers, as illustrated in step 502. Each film layer being of a different type than its adjacent layers. In step 504, the deposited film layers are sectioned to expose a patterned surface. The patterned surface is then polished as indicated in step 506. In step 508, the exposed patterns are selectively etched to expose patterns comprised of one of the types of film to a predetermined depth to produce a selectively etched surface. In step 510, magnetic material is deposited within etches of the surface, as indicated in step 510. In step 512, the surface is planarized to form separated magnetic tracks therein.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A method comprising:
   (a) producing a cylindrical object comprising two or more layers of film formed around a cylindrical central core along a radial direction normal to a central axis, each of the layers comprising a different material than a respective adjacent layer;
   (b) producing a substrate by cutting a section of the cylindrical object along the radial direction, wherein the substrate has an exposed surface including a patterned portion comprising adjacent layers of the film in the radial direction;
   (c) smoothing the exposed surface of the substrate;
   (d) selectively etching the exposed surface of the substrate to form an etched surface;
   (e) depositing a magnetic material on the etched surface; and
   (f) smoothing the etched surface to form separated magnetic tracks therein.

2. The method of claim 1, further comprising using a solid rod as the central core.

3. The method of claim 1, further comprising using a hollow cylinder as the central core.

4. The method of claim 1, wherein step (a) comprises: rotating the central core during forming of the layers.

5. The method of claim 1, wherein step (a) further comprises:
   rotating deposition sources of the respective different materials of each of the layers around the central core.

6. The method of claim 1, where step (a) comprises using silicon dioxide, silicon nitride, silicon, tungsten, tantalum, or molybdenum as at least first and second ones of the different materials.

7. The method of claim 1, wherein step (a) comprises:
   using sputter deposition, chemical vapors deposition, magnetron biased sputtering, or plasma vapor deposition.

8. The method of claim 1, wherein step (a) is continued until a predetermined combined diameter of the central core and the layers is approximately reached.

9. The method of claim 8, wherein the predetermined diameter is between about 85 and about 90 mm.

10. The method of claim 1, wherein step (a) comprises:
    using a deposition process such that the layers formed by the deposition process comprise circularly symmetrical concentric ring structures around the central core.

11. The method of claim 1, wherein step (a) comprises:
    using a baffled deposition process such that the layers formed by the baffled deposition process comprise a spiral structure around the central core.

12. The method of claim 1, wherein step (d) comprises forming trenches of a predetermined depth separated by raised tracks of a predetermined width within the surface.

13. The method of claim 12, wherein the predetermined depth of the trenches is approximately 45 nm.

14. The method of claim 12, wherein the predetermined width of the raised tracks is approximately within a range of 1 to 100 nm.

15. The method of claim 12, wherein the predetermined width of the raised tracks is approximately 30 nm.

16. The method of claim 1, wherein step (d) comprises:
    using a plasma type etcher.

17. The method of claim 16, wherein the plasma type etcher is a reactive ion etcher.

18. The method of claim 1, wherein step (f) comprises:
    using chemical mechanical polishing, or sputter etching a planarizing material coating, having etch selectivity against the deposited magnetic material.

19. The method of claim 1, wherein step (a) further comprises:
    controlling respective thicknesses of the layers to accommodate a predetermined format structure.

20. The method of claim 1, wherein the separated magnetic tracks have a width of approximately 10 nm.